United States Patent [19]

Taketoshi et al.

[11] Patent Number: 5,389,898
[45] Date of Patent: Feb. 14, 1995

[54] PHASE LOCKED LOOP HAVING PLURAL SELECTABLE VOLTAGE CONTROLLED OSCILLATORS

[75] Inventors: Osamu Taketoshi; Tsuguyasu Hatsuda; Seiji Yamaguchi, all of Osaka, Japan

[73] Assignee: Matsushita Electric Industrial Co., Ltd., Osaka, Japan

[21] Appl. No.: 79,530

[22] Filed: Jun. 22, 1993

[30] Foreign Application Priority Data

Jun. 22, 1992 [JP] Japan ................... 4-162477

[51] Int. Cl.⁶ .................. H03L 7/099; H03L 7/18
[52] U.S. Cl. ............................. 331/2; 331/14; 331/16; 331/25; 331/34; 331/49; 331/57
[58] Field of Search ............ 331/2, 14, 16, 25, 34, 331/49, 57

[56] References Cited

U.S. PATENT DOCUMENTS 4,978,927  12/1990  Hausman et al. ................ 331/57

FOREIGN PATENT DOCUMENTS 2938780  3/1981  Germany ..................... 331/2
2104742  3/1983  United Kingdom ............. 331/2

OTHER PUBLICATIONS

Young, et al., "A PLL Clock Generator with 5 to 110 MHz Lock Range for Microprocessors", ISSCC Digest of Technical Papers, pp. 50–51, Feb. 1992.

*Primary Examiner*—Siegfried H. Grimm
*Attorney, Agent, or Firm*—Willian Brinks Hofer Gilson & Lione

[57] ABSTRACT

The invention discloses a PLL formed by a phase detector, a filter, three VCO's (VCO1, VCO2, and VCO3), a multiplexer, and a frequency divider. The VCO1, VCO2, and VCO3 have different mean frequencies, each oscillating at a frequency controlled according to the voltage value of a phase control signal from the filter. The multiplexer selects one of the VCO's which operate in parallel. If a pulse of a digital phase difference signal UP indicating that an internal signal is delayed in phase with respect to a reference signal is output twice in succession, or if a pulse of a digital phase difference signal DOWN indicating that an internal signal is advanced in phase with respect to a reference signal is output twice in succession, a counter makes the multiplexer change its current VCO selection via a shift register. Accordingly, high-speed PLL pulling is achievable even if a PLL frequency variable-range is expanded.

11 Claims, 10 Drawing Sheets

F I G. 2
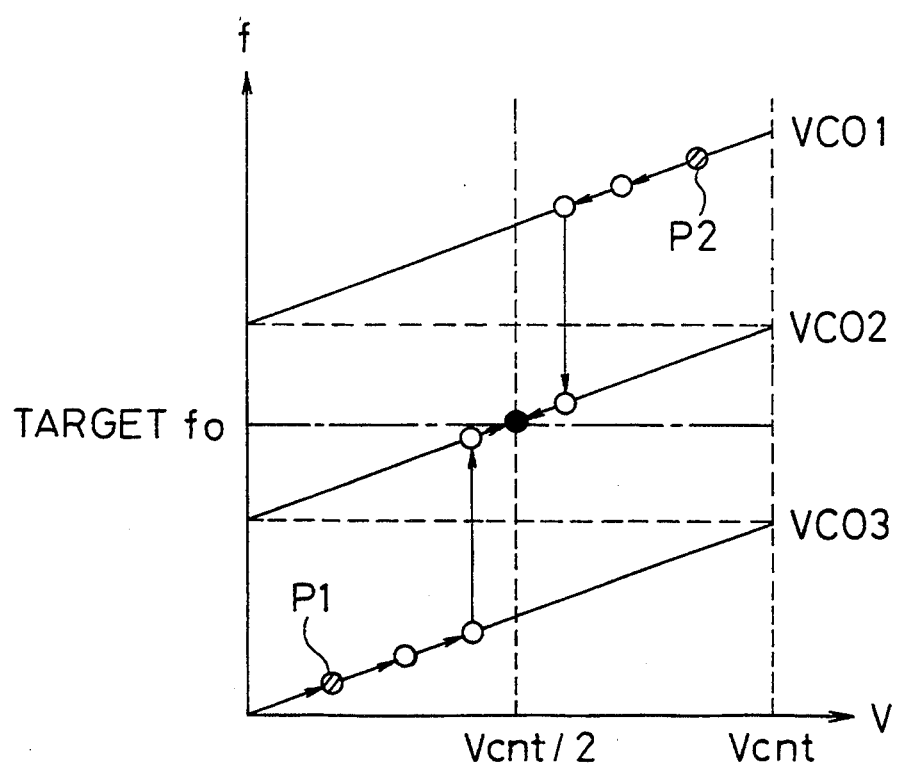

F I G. 6
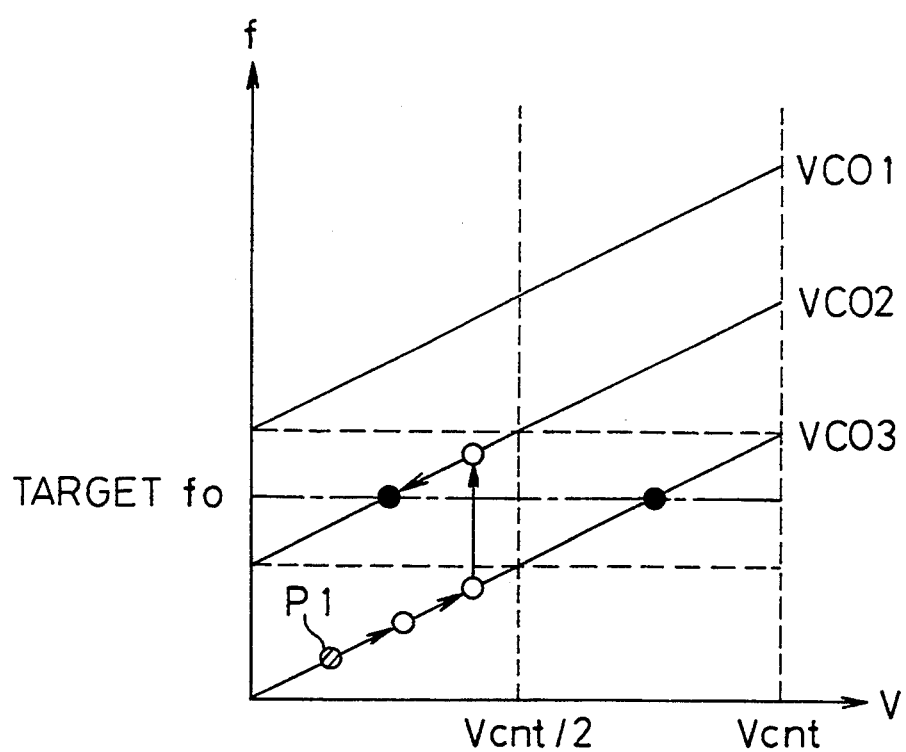

PHASE LOCKED LOOP HAVING PLURAL SELECTABLE VOLTAGE CONTROLLED OSCILLATORS

BACKGROUND OF THE INVENTION

This invention pertains to phase-locked loops (PLL) and involves techniques applicable to clock generators incorporated into microprocessors.

PLL's have been finding applications in clock generators. For example, a PLL is used for the phase lock between circuit blocks of a microprocessor and for the generation of a multiplication-frequency clock signal.

FIG. 10 illustrates the conventional configuration of PLL's. A PLL of FIG. 10 comprises a phase detector 30, a filter 31, a voltage-controlled oscillator (VCO) 32, and a frequency divider 33. The phase detector 30 compares the phase of an incoming reference signal $\phi 1$ with that of an internal signal $\phi 2$, thereby producing an analog phase difference signal ($V_{pc}$) proportional to the phase difference found between the signals. The filter 31 integrates the $V_{pc}$ to produces a phase control signal ($V_{cnt}$). The VC0 32 produces a basic clock signal ($\phi 0$) according to the $V_{cnt}$. The output frequency of the VCO32 is controlled according to the input voltage (i.e. the voltage of the $V_{cnt}$, or the control voltage), which causes a change in the frequency of the $\phi 0$. The frequency divider 33 is a divider which frequency divides the $\phi 0$ to produce the internal signal $\phi 2$ with a 50% duty ratio. This $\phi 2$ is fed back to the phase detector 30 as one input thereof. For example, if the frequency divider 33 is given a divide ratio of $\frac{1}{4}$, and if an output whose frequency is one-half that of the $\phi 0$ is fetched from the intermediate tap, it is possible to produce a 50%-duty-ratio multiplication-frequency clock signal whose frequency is twice that of the $\phi 1$.

A PLL of this type is disclosed by I. A. Young et al ("A PLL Clock Generator with 5 to 110 MHz Lock Range for Microprocessors", ISSCC Digest of Technical Papers, pp. 50–51, February, 1992).

The effect of expanding the frequency variable-range of a PLL is known. For example, the expansion of a PLL frequency variable-range gives an advantage to distinguish the use of a high-frequency part of the expanded range from the use of a low-frequency part. In other words, the high-frequency part is assigned to actual operations and the low-frequency part to operation testing. Test tools used for testing in the low-frequency range are available at a low price compared to ones for testing in the high-frequency range. Accordingly, low-cost testing is achievable. However, for the case of a conventional PLL like the one as shown in FIG. 10, the expansion of a PLL frequency variable-range presents a difficult problem. In other words, it is hard to realize a VCO having a highly linear input/output characteristic, since, if a PLL frequency variable-range is expanded, such an expanded frequency variable-range must be covered by the VCO 32 alone. In addition to such a problem, other serious problems such as one which causes delays in the pulling of a PLL, or increases the pull-in time of a PLL.

DISCLOSURE OF THE INVENTION

It is an object of the present invention to provide an improved PLL capable of realizing high-speed pulling even if the frequency variable-range of such a PLL is expanded.

In a first PLL of the invention, plural VCO's with different mean frequencies are provided and one of these VCO's is selected depending on the internal state of the PLL. More specifically, this PLL comprises (a) a phase detector for comparing the phase of a reference signal with the phase of an internal signal to produce a phase difference signal proportional to the phase difference found between the signals, (b) a filter for producing a phase control signal with a voltage value proportional to the phase difference signal, (c) a plurality of voltage-controlled oscillators with different mean frequencies which oscillate at a frequency controlled according to the voltage value of the phase control signal, (d) a selector for selecting one of the outputs of the voltage-controlled oscillators on the basis of the phase difference signal or the phase control signal, and (e) a frequency divider for dividing the frequency of the selected output to produce an internal signal.

In accordance with the first PLL, each VCO tracks a target frequency. During such target frequency tracking, a "frequency jump" occurs due to a change in VCO selection from one of the VCO's which oscillates at a certain frequency to another VCO which oscillates at a nearby frequency to the target frequency. This provides a PLL capable of realizing high-speed pulling. Further, a VCO with a highly linear input/output characteristic can be realized easily, since the frequency variable-range of each VCO can be held small even if a total PLL frequency variable-range is expanded. Furthermore, the reduction of pull-in time of each VCO is possible.

Additionally, If, when a phase control signal changes its voltage value, the plural VCO's vary their respective output frequencies exactly by a proportional amount, the loop gain of the entire PLL can be held constant, regardless of the change in VCO selection. There is another advantage that the damping factor and bandwidth of the loop can also be held constant. If the plural VCO's have different frequency variable-ranges with overlaps, this prevents these VCO's from being selected in a circulative manner. This provides a PLL capable of realizing high-speed pulling. If the selector selects one of the outputs of the plural VCO's on the basis of the hysteresis of a phase difference signal or a phase control signal, this makes the selection/control of an optimum VCO easy. If the selector has a configuration which permits itself to select one of the outputs of the plural VCO's under control from the outside of the PLL, this leads to the reduction of PLL pull-in time at the initial activation. If the frequency divider has a divide ratio of 1/n with the number n being a positive integral number, it is easy to generate a multiplication-frequency clock signal with a 50% duty ratio.

In a second PLL of the invention, a VCO which is not being selected stops oscillating. More specifically, this PLL comprises (a) a phase detector for comparing the phase of a reference signal with the phase of an internal signal to produce a phase difference signal proportional to the phase difference found between the signals, (b) a filter for producing a phase control signal with a voltage value proportional to the phase difference signal, (c) a plurality of voltage-controlled oscillators with different mean frequencies which oscillate at a frequency controlled according to the voltage value of the phase control signal, (d) a controller for switching between the oscillating state and the stopped state of each of the voltage-controlled oscillators, (e) a selector for selecting one of the outputs of the voltage-controlled oscillators on the basis of the phase difference signal or the phase control signal, and (f) a frequency divider for dividing the frequency of the selected output to produce an internal signal.

In accordance with the second PLL, it is possible to stop a VCO, which is not being selected, from operating if the PLL is in phase lock. This results in the reduction of power consumption by the PLL. If the operation of the controller is controlled on the basis of a phase difference signal, it is possible to make a VCO oscillate or stop oscillating depending on the internal state of the PLL.

In a third PLL of the invention, a programmable VCO is provided, which is capable of changing its frequency characteristic depending on the internal state of the PLL. More specifically, this PLL comprises (a) a phase detector for comparing the phase of a reference signal with the phase of an internal signal to produce a phase difference signal proportional to the phase difference found between the signals, (b) a filter for producing a phase control signal with a voltage value proportional to the phase difference signal, (c) a voltage-controlled oscillator formed by linking a plurality of delay circuits whose delay times are controlled according to the voltage value of the phase control signal, (d) a selector for selecting a particular number of linkages of the delay circuits on the basis of the phase difference signal or the phase control signal, and (e) a frequency divider for dividing the frequency of the output of the voltage-controlled oscillator to produce an internal signal.

In accordance with the third PLL, by selecting a particular number of linkages of the delay circuits in the single VCO depending on the internal state of the PLL, the frequency characteristic of the VCO can timely be changed. This frequency characteristic change causes a "frequency jump" to occur so that the PLL becomes capable of high-speed pulling even if a PLL frequency variable-range is expanded. Further, because the delay circuits are shared partly, it is possible to reduce the area of a VCO and power consumption. If the selector selects a particular number of linkages of the delay circuits on the basis of the hysteresis of a phase difference signal or a phase control signal, this makes the selection/control of an optimum VCO easy. If the selector is given a configuration which permits it to select a particular number of linkages of the delay circuits, this leads to the reduction of PLL pull-in time at the initial activation. If the frequency divider is given a divide ratio of 1/n with the number n being a positive integral number, it is easy to generate a multiplication-frequency clock signal with a 50% duty ratio.

BRIEF DESCRIPTION OF THE DRAWINGS

FIG. 2 is a frequency-characteristic diagram illustrating how a PLL of the first example tracks a target frequency, without the frequency variable-ranges of VCO's of the PLL overlapped.

FIG. 6 is a frequency-characteristic diagram illustrating how a PLL of the first example tracks a target frequency, with the frequency variable-ranges of VCO's of the PLL overlapped.

DESCRIPTION OF THE INVENTION

PLL's in accordance with the present invention are described by reference to the drawings.

EXAMPLE I

Figure 1:
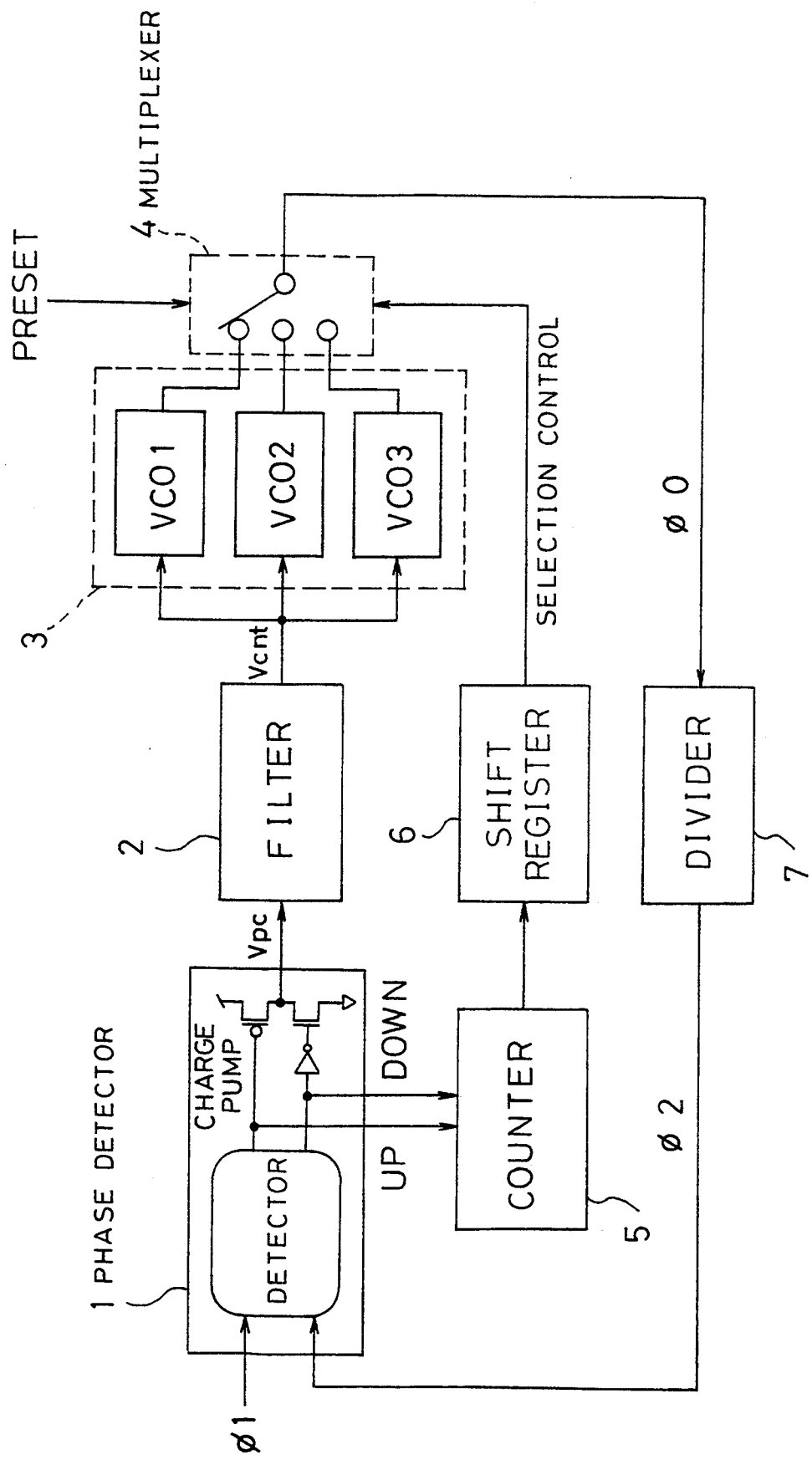
FIG. 1 is a block diagram showing a PLL of the first example of the present invention.

FIG. 1 shows a PLL of the first example. This PLL comprises a phase detector 1, a filter 2, three voltage-controlled oscillators 3 (VC01, VC02, and VC03), a multiplexer 4, a counter 5, a shift register 6, and a frequency divider 7. The phase detector 1 is divided into two section a phase detector unit and a charge pump. The phase detector unit compares the phase of an incoming reference signal $\phi 1$ with the phase of an internal signal $\phi 2$, thereby delivering a digital phase difference signal UP or a digital phase difference signal DOWN proportional to the phase difference found between the $\phi 1$ and the $\phi 2$. The signal UP is a pulse signal indicating that the $\phi 2$ is delayed in phase with respect to the $\phi 1$. The signal DOWN also is a pulse signal indicating that the $\phi 2$ is advanced in phase with respect to the $\phi 1$. The charge pump, depending on the signal UP or the signal DOWN, sends out an analog phase difference signal ($V_{ps}$) with a voltage value proportional to the phase difference between the $\phi 1$ and the $\phi 2$. The filter 2 integrates the $V_{ps}$ to produce an analog phase control signal ($V_{cnt}$). The VCO1, VCO2, and VCO3 have different mean frequencies and their oscillator frequency is controlled according to the voltage value of the $V_{cnt}$ from the filter 2. Of these three VCO's the VCO1 has the highest mean frequency and the VCO3 is given the lowest. The multiplexer 4 is a selector used to select one of the outputs of the VCO1, VCO2, and VCO3 under parallel running, as a basic clock signal ($\phi 0$). Upon receiving a pulse of the signal UP or the signal DOWN twice in succession from the phase detector 1, the counter 5 delivers a shift signal to the shift register 6. The shift register 6 is a register capable of storing selection control data for the multiplexer 4 to select a desired output. Such data is updated upon application of a shift signal from the counter 5. The frequency divider 7 divides the frequency of the $\phi 0$ to generate the $\phi 2$ with a 50% duty ratio. This $\phi 2$ is fed back to the phase detector 1 as one input thereof.

Based on either an external preset signal or a selection control signal, the multiplexer 4 selects one of the outputs of the VCO's. An external preset signal is a preset signal which allows the multiplexer 4 to select one of the VCO1, VCO2, and VCO3 before the PLL becomes activated. This makes it possible for the PLL to start tracking a target frequency at any operating point.

FIG. 2 is an example illustrating the frequency characteristics of the VCO1, VCO2, VCO3. The abscissa indicates the control voltage V (i.e. the voltage value of the $V_{cnt}$) and the ordinate indicates the frequency of oscillation f. In these VCO frequency characteristics, when the control voltage V varies, the frequency of oscillation f varies exactly by a proportional amount (that is, the VCO1, VCO2, and VCO3 have the same gain), and the frequency variable-ranges of the VCO1, VCO2, VCO3 do not overlap one another.

FIG. 2 also shows how a PLL of FIG. 1 tracks a target frequency f0 on the condition that the target frequency f0 lies inside the frequency variable-range of the VCO2.

Figure 3:
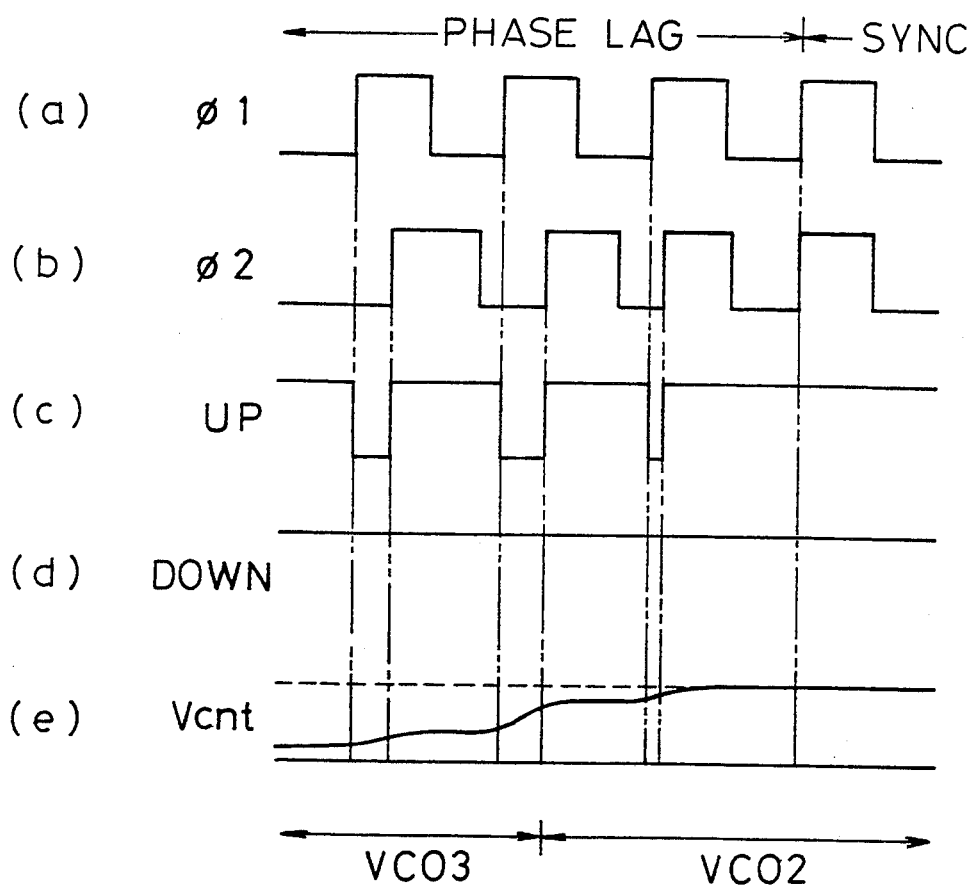
FIG. 3 shows waveforms of different signals when a PLL of FIG. 1 starts tracking at P1 of FIG. 2.

When the tracking of the target frequency f0 starts at operating point P1 of FIG. 2, the multiplexer 4 is currently selecting an output of the VCO3. At P1, the VCO3 oscillates at a frequency much lower than the target frequency f0, and the phase difference (i.e. the frequency difference) between the $\phi 1$ and the $\phi 2$ is great. This increases not only the voltage value of the $V_{ps}$ from the phase detector 1 but also that of the $V_{cnt}$ from the filter 2. As a result, the operating point of the PLL moves up along the characteristic line of the VCO3, and thus the frequency of oscillation f increases. Meanwhile, the phase detector 1 continuously outputs pulses of the signal UP indicating that the $\phi 2$ is delayed in phase with respect to the $\phi 1$. The counter 5 counts such pulses. At the time when a pulse of the signal UP is output twice in succession, a shift signal is applied to the shift register 6 so that the multiplexer 4 changes its current VCO selection from the VCO3 to the VCO2. Here, the operating point of the PLL makes a transition onto the characteristic line of the VCO2 and the frequency of oscillation f jumps to the vicinity of the target frequency f0. This rapidly allows the PLL to become locked-in to the $\phi 1$ by means of the VCO2. FIG. 3 illustrates the above-described tracking at operating point P1 using signal waveforms.

Figure 4:
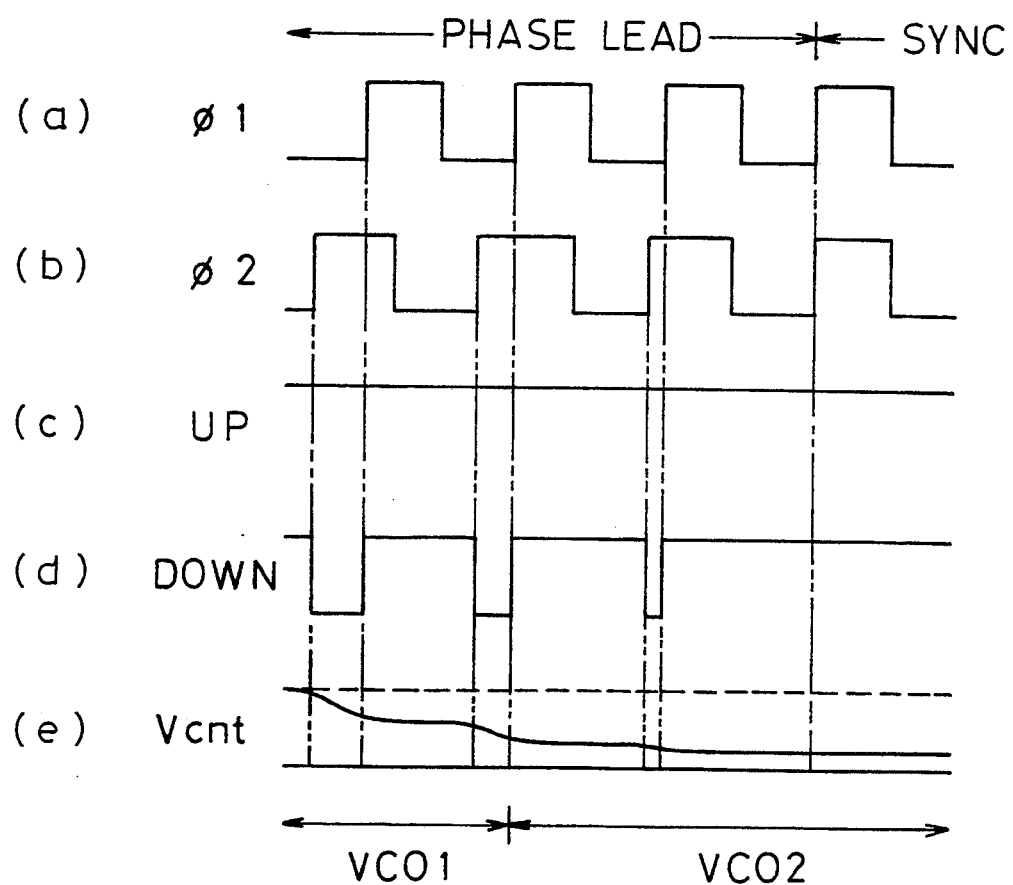
FIG. 4 is similar to FIG. 3 but shows waveforms of different signals when a PLL of FIG. 1 starts tracking at P2 of FIG. 2.

When the tracking of the target frequency f0 starts at operating point P2 of FIG. 2, the multiplexer 4 changes its current VCO selection from the VCO1 to the VCO2 at the second pulse of the signal DOWN of FIG. 4 indicating that the $\phi 2$ is advanced in phase with respect to the $\phi 1$. This also rapidly allows the PLL to become locked-in to the $\phi 1$ as in the case of the tracking of the target frequency f0 started at operating point P1.

In the present example, the frequency jump occurs when the multiplexer 4 changes its current VCO selection from one VCO to the other. This results in rapidly pulling the PLL into phase lock. Further, a VCO with a highly linear input/output characteristic is easily achievable, since the frequency variable-range covered by each VCO can be held small in spite of the expansion of a total PLL frequency variable-range. Additionally, the reduction of pull-in time of each VCO is possible. In this way, the frequency variable-range of a PLL can be expanded without causing any trouble, so that actual operations and operation testing can be run at respective separate frequency parts in the expanded range. This contributes to lowering operation testing costs. There is a further advantage that a PLL, even if one of the VCO's goes out of order, can still perform its function with the help of the remaining operational VCO's, but in a limited range.

Figure 5:
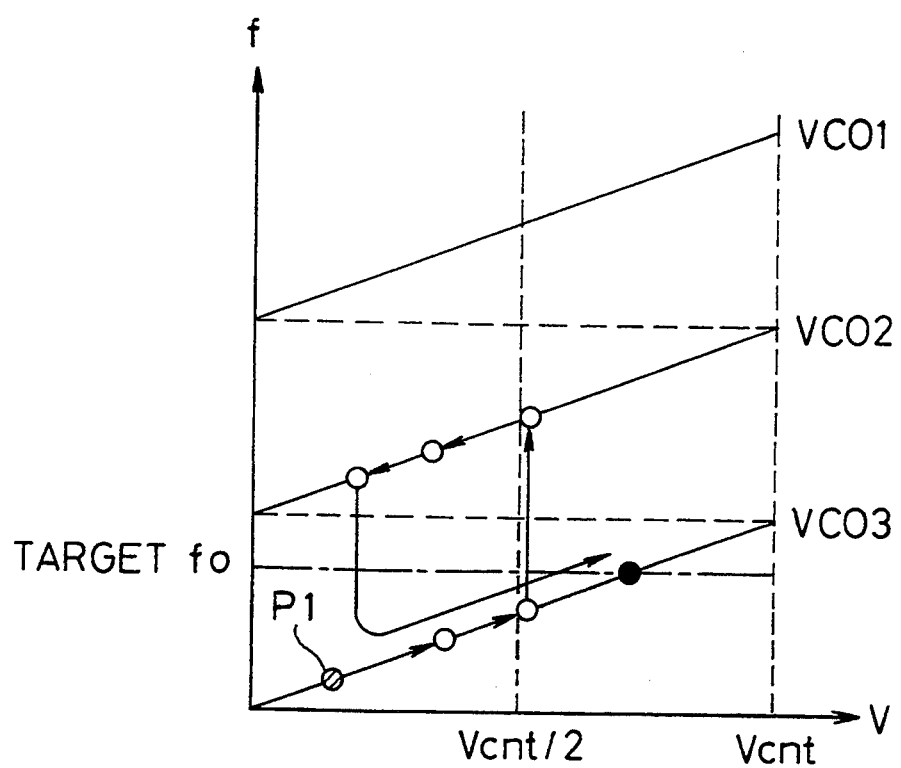
FIG. 5 is an illustration showing that the tracking of a target frequency by a PLL is delayed because of the frequency characteristics as shown in FIG. 2.

As shown in FIG. 2, If the VCO1, VCO2, and VCO3 have frequency variable-ranges with no overlaps among them, circulative VCO selection may occur during target frequency tracking. If the target frequency f0 lies inside the frequency variable-range of the VCO3, and if the tracking starts at operating point P1 at which the $\phi 2$ is delayed in phase with respect to the $\phi 1$, as shown in FIG. 5, the VCO selection circulates from VCO3 to VCO2 to VCO3. In other words, the operating point of the PLL has to make a detour on the way to the target frequency f0. In other words, this causes delays in pulling a PLL into phase lock.

Such delays in pulling can be eliminated by making the frequency variable-ranges of the VCO1, VCO2, and VCO3 overlap one another, as shown in FIG. 6. Since the target frequency f0 is covered not only by the frequency variable-range of the VCO3 but also by that of the VCO2, phase locking to the target frequency f0 can rapidly be achieved by means of the VCO2. The effect of employing the frequency characteristics of FIG. 6 gives an advantage that a desired total PLL frequency variable-range can still thoroughly be covered-even if there exist among the VCO's variations in gain. This means that a higher production yield can be obtained if the length of a overlap is determined by making allowances for gain variations.

Temporary system instability is likely to occur immediately after a VCO selection is carried out. However, the system will regain its stability, since pulling is possible as long as the operating frequency lies inside a capture range. From this, it is understood that, within a range where tracking does not make a detour, the VCO1, VCO2, and VCO3 do not necessarily have the same gain. In the present example, the VCO1, VCO2, and VCO3 are given the same gain. Because of this, the loop gain of the entire PLL remains unchanged, being unaffected by the VCO selection. As a result, the damping factor and bandwidth of the loop also become constant.

Further, in the present example, the internal state of the PLL is detected on the basis of the hysteresis of the signals UP and DOWN. Instead, monitor results as to the hysteresis of the increase and decrease in the voltage value of either the $V_{pc}$ or the $V_{cnt}$ may be used. The number of VCO's to be provided may change depending on the operating condition. Instead of using the multiplexer 4, different types of selecting means such as a transfer gate and a relay circuit may be employed. If the divide ratio of the frequency divider 7 is set to 1/n (the number n is a positive integral number), a desired multiplication-frequency clock signal with a 50% duty ratio can be obtained easily.

EXAMPLE II

Figure 7:
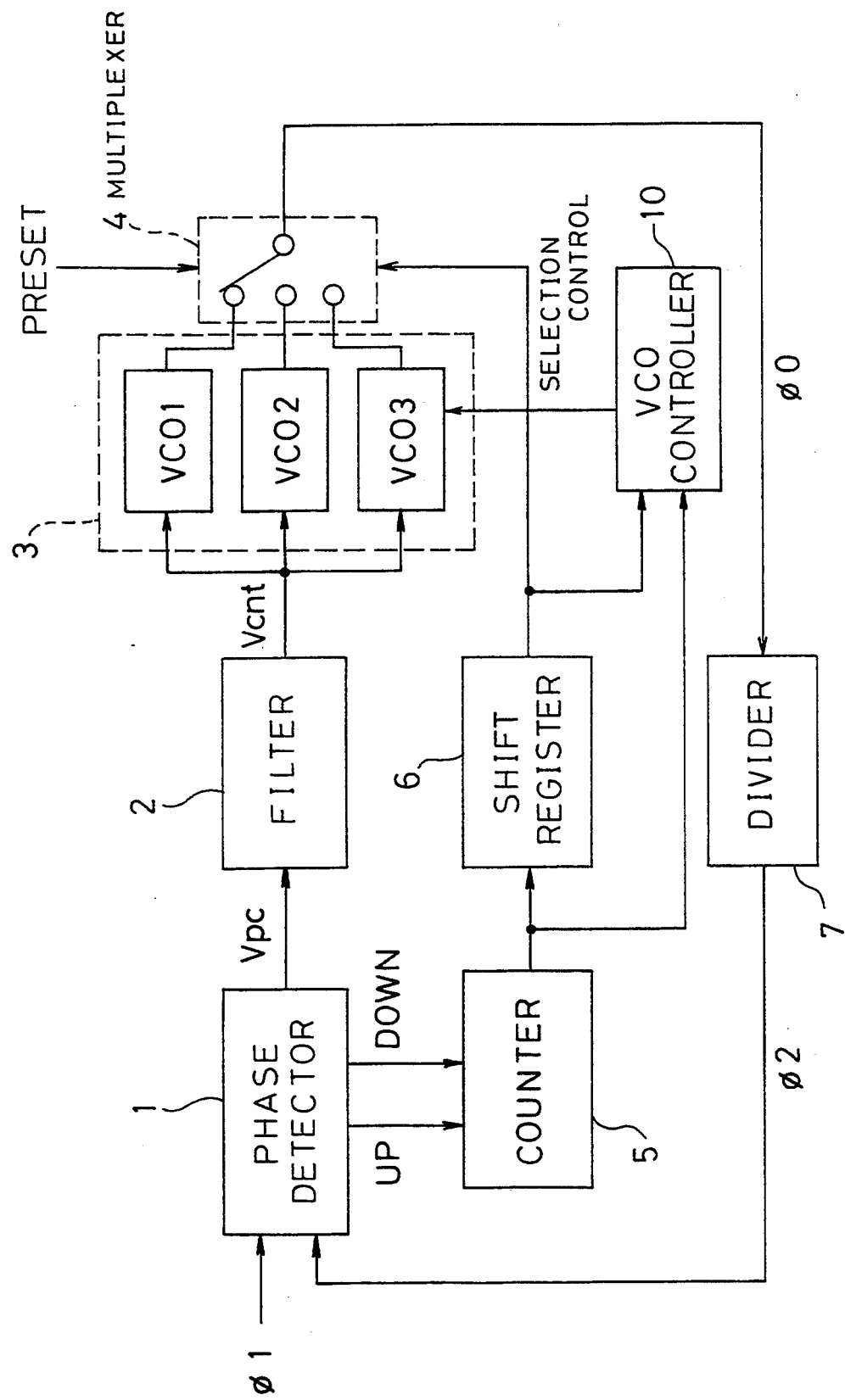
FIG. 7 is a block diagram showing a PLL of the second example of the present invention.

FIG. 7 shows a PLL of the second example of the present invention. This PLL is similar in configuration to the one of FIG. 1 but includes a VCO controller 10. The frequency characteristics of the VCO1, VCO2, and VCO3 are shown in either FIG. 2 or FIG. 6. The VCO controller 10 is a circuit which, in response to a shift signal delivered by the counter 5 on the basis of the signal UP or the signal DOWN from the phase detector 1 and a selection control signal from the shift register 6, performs the function of switching between the oscillating state and the stopped state of each of the VCO1, VCO2, and VCO3. The following describe how the VCO controller 10 functions depending on the internal state of the PLL.

(1) Initial State

The counter 5 attempts to select one of the VCO1, VCO2, and VCO3 through the shift register 6 to cause a sudden change in the oscillator frequency. Upon receiving a shift signal from the counter 5, the VCO controller 10 exerts control so as to make each VCO oscillate. Accordingly, like the VCO selection in the first example, the tracking of the target frequency (i.e. the pulling of the PLL) is achievable at a high speed.

(2) Phase Lock State

When the counter 5 stops outputting a shift signal, the VCO controller 10 makes a decision that the PLL is being in phase lock while at the same time it gains current VCO selection information from a selection control signal from the shift register 6 to stop two VCO's, excluding the one being selected, from oscillating. In this way, less power consumption is possible compared to the first example by stopping a VCO not in use from operating.

When the PLL happens to go out of phase due to changes in the frequency of the $\phi 1$, noise from the outside of the PLL, or the like, the VCO controller 10 switches between the operation of (1) or the operation of (2) depending on whether the counter 5 outputs a shift signal. More specifically, if a change occurred is negligible (i.e. a change not requiring VCO switching), the counter 5 outputs no shift signals and thus, the operation as described in (2) is carried out continuously. In other words, re-pulling is accomplished by a single VCO being selected. Conversely, if a change occurred is great (i.e. a change requiring VCO switching), the counter 5 outputs a shift signal and thus the operation as described in (1) is carried out. Because of this, high-speed re-pulling is achievable through the foregoing frequency jump.

EXAMPLE III

Figure 8:
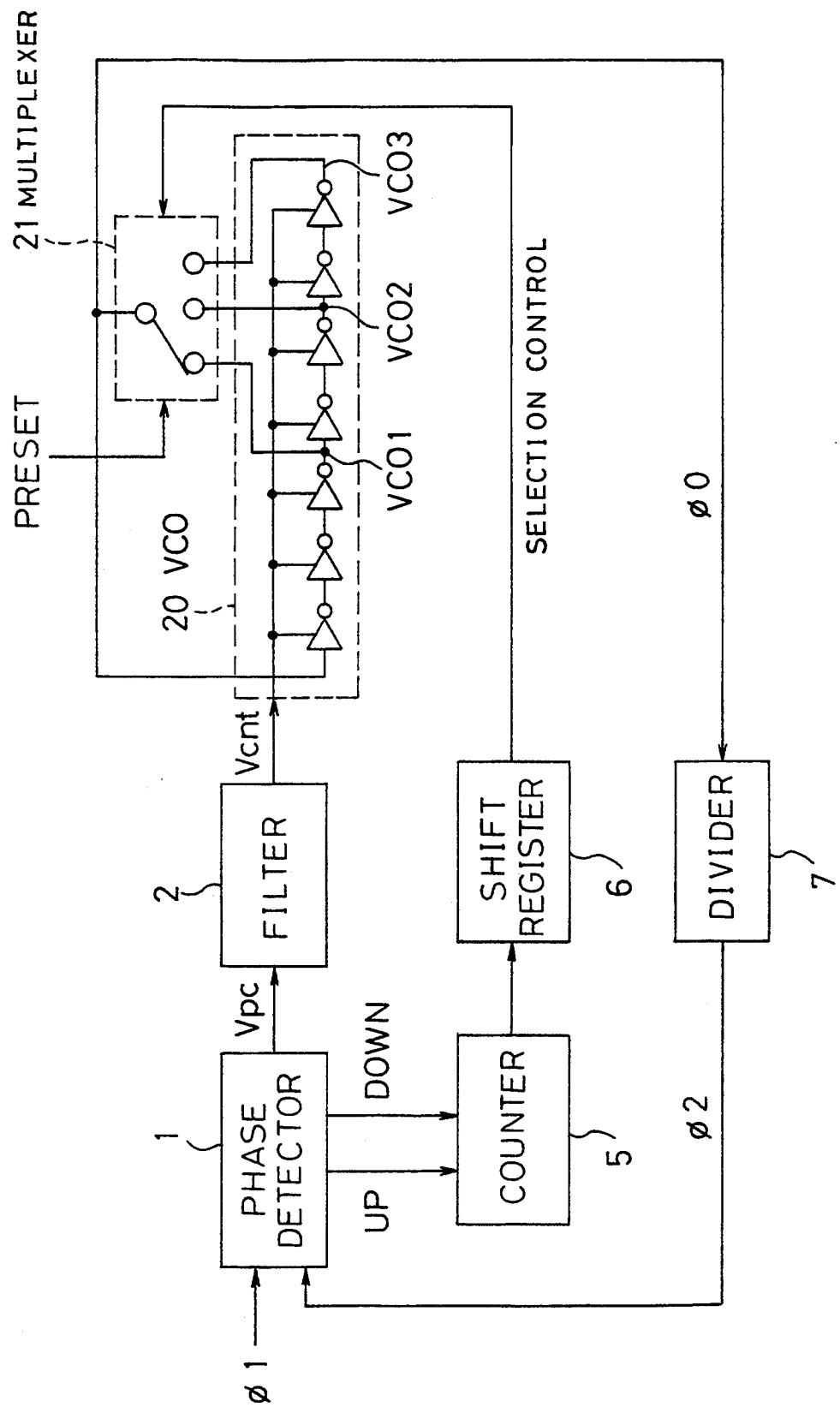
FIG. 8 is a block diagram showing a PLL of the third example of the present invention.

FIG. 8 shows a PLL of the third example. This PLL includes a single VCO20 and a multiplexer 21 in addition to the phase detector 1, the filter 2, the counter 5, the shift register 6, and the frequency divider 7 as shown in the fist example.

In the present example, the VCO20 comprises a chain of seven inverters. The third-, fifth-, and seventh-stage inverters output VCO1, VCO2, and VCO3, respectively. One of the VCO1, VCO2, and VCO3 is selected by the multiplexer 21 and fed back to the first-stage inverter. In other words, the number of changeable stages of the inverter chain constituting a ring oscillator is three. When the VCO1 is selected, the frequency of oscillation becomes maximized, while on the other hand, when the VCO3 is selected, it becomes minimized. These seven inverters each have, in addition to a non-inversion input terminal and an inversion output terminal, a delay control input terminal. The $V_{cnt}$ from the filter 2 is mutually applied to every delay control input terminal. Accordingly, the voltage value of the $V_{cnt}$ varies with the delay time of each inverter, so that it is possible to change the frequency of oscillation of the VCO20.

Figure 9:
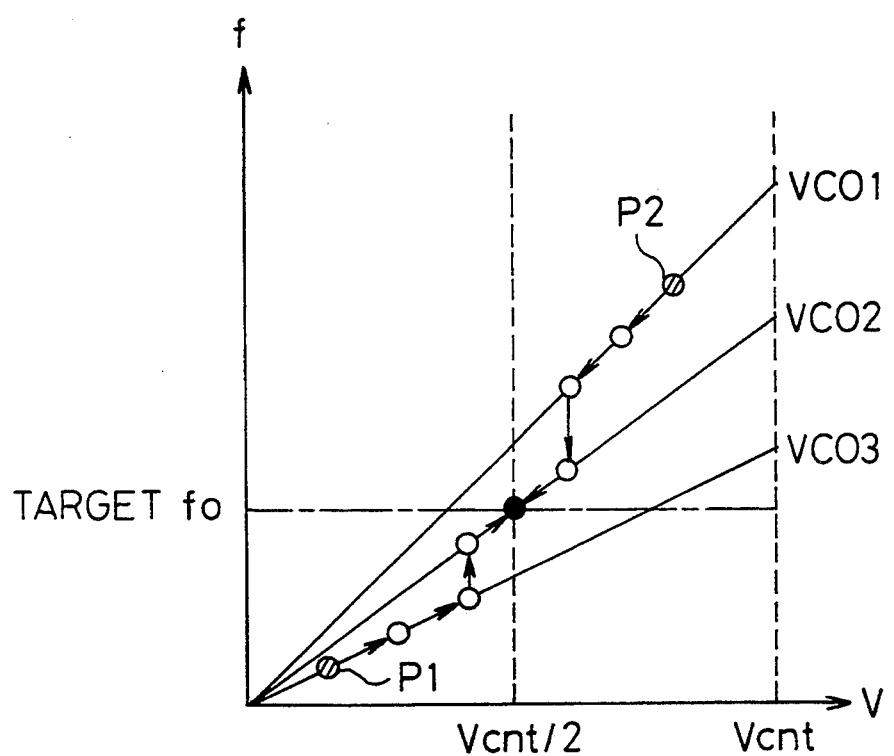
FIG. 9 is a VCO frequency-characteristic diagram illustrating how a PLL of FIG. 8 tracks a target frequency.
Figure 10:
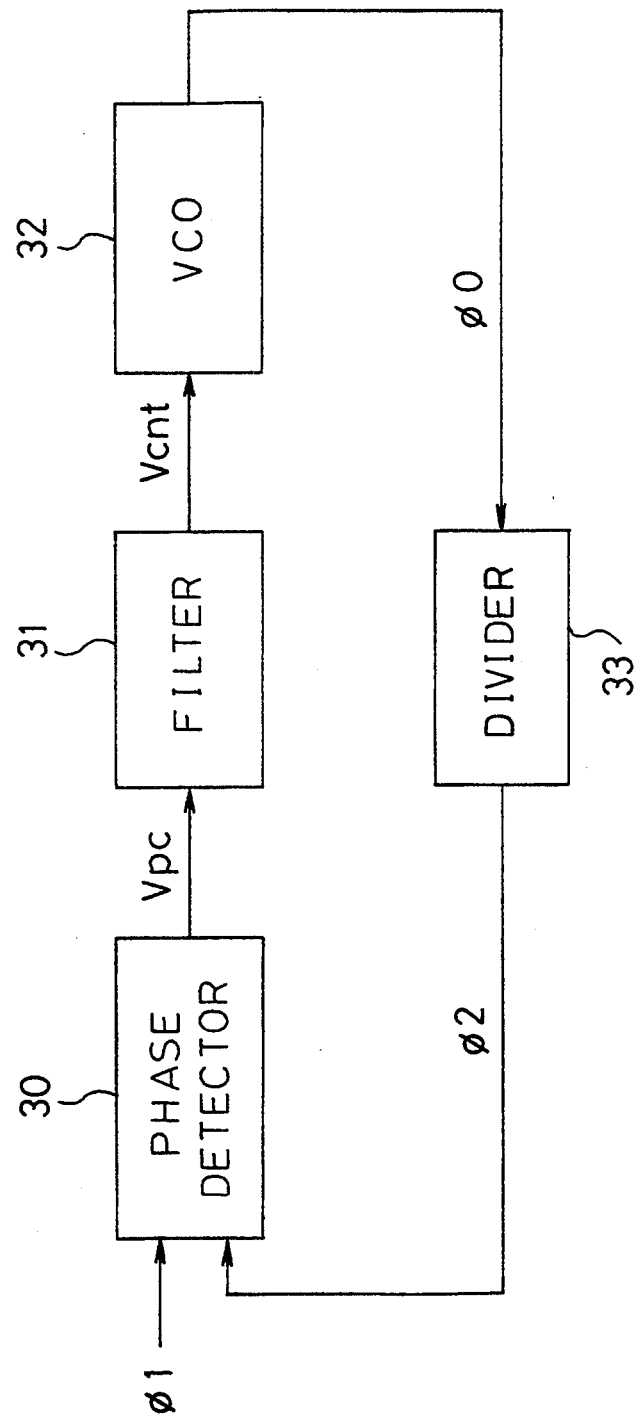
FIG. 10 is a block diagram illustrating a conventional PLL.

Based on either an external preset signal or a selection control signal from the shift register 6, the multiplexer 21 selects one of the VCO1, VCO2, and VCO3. Accordingly, it is possible to divide the frequency characteristic of the VCO20 into three stages. FIG. 9 is an example showing the frequency characteristics indicated by VCO1, VCO2, and VCO3 with different gains and with different frequency variable-ranges overlapping one another.

FIG. 9 shows also the tracking of the target frequency f0 by the PLL of FIG. 8. When the tracking of the target frequency f0 starts at operating point P1 of the FIG. 9, the multiplexer 21 is selecting the VCO3 frequency characteristic. In this state, the VCO20 oscillates at a frequency much lower than the target frequency f0, and thus the difference in phase between the $\phi 1$ and the $\phi 2$ is great. Accordingly, the voltage value of the $V_{pc}$ from the phase detector 1 increases with that of the $V_{cnt}$ from the filter 2. As a result, the operating point of the PLL moves up along the VCO3 frequency characteristic line and thus the frequency of oscillation f increases. Meanwhile, pulses of the signal UP indicative of the $\phi 2$ being delayed in phase with respect to the $\phi 1$ are output continuously and the counter 5 counts such pulses. At the time when a pulse of the UP signal is output twice in succession, a shift signal is applied to the shift register 6. The multiplexer 21 then changes its characteristic selection from the VCO3 to the VCO2. Consequently, the operation point of the PLL makes a transition to the VCO2 frequency characteristic line and the frequency of oscillation f makes a frequency jump to the vicinity of the target frequency f0. This rapidly pulls the PLL into phase lock to the $\phi 1$.

When the tracking of the target frequency f0 starts at operating point P2 of FIG. 9, the multiplexer 21 changes its characteristic selection from the VCO1 to the VCO2 at the second pulse of the signal DOWN indicative of the $\phi 2$ being advanced in phase with respect to the $\phi 1$. This also rapidly pulls the PLL into phase lock.

In the present example, since the frequency jump occurs as described above, high-speed PLL pulling is achievable in spite of the expansion of a PLL frequency variable-range. Further, the inverters in the VCO20 are shared partly so that the VCO20 requires a smaller area and less power in comparison with the first example.

Further, in the present example, the internal state of the PLL is detected on the basis of the hysteresis of the signals UP and DOWN. However, monitor results as to the hysteresis of the increase and decrease in the voltage value of either the $V_{pc}$ or the $V_{cnt}$ may be used. The number of stages of an inverter chain constituting the VCO20 may change depending on the operating condition. Instead of employing an inverter in the VCO20, it is possible to use a delay circuit formed by a differential circuit in accordance with the prior art technique disclosed by I. A. Young et al mentioned above. Instead of the multiplexer 21, different types of selecting means such as a transfer gate and a relay circuit may be employed. If the divide ratio of the frequency divider 7 is set to the ratio of 1/n (the number n is a positive integral number), a desired 50%-duty-ratio multiplication-frequency clock signal can be obtained easily.

The invention claimed is:

1. A phase-locked loop comprising:

a phase detector for comparing the phase of a reference signal with the phase of an internal signal to produce a phase difference signal proportional to the phase difference found between the signals, a filter for producing a phase control signal with a voltage value proportional to the phase difference signal, a plurality of voltage-controlled oscillators with different mean frequencies which oscillate at a frequency controlled according to the voltage value of the phase control signal, a selector for selecting one of the outputs of said plurality of voltage-controlled oscillators on the basis of the phase difference signal or the phase control signal, and a frequency divider for dividing the frequency of the selected output to produce said internal signal, wherein, when said phase control signal changes its voltage value, said plurality of voltage-controlled oscillators vary their output frequencies equal amounts.

2. A phase-locked loop as in claim 1, wherein said plurality of voltage-controlled oscillators have different frequency variable-ranges which overlap one another.

3. A phase-locked loop as in claim 1, wherein said selector selects one of the outputs of said plurality of voltage-controlled oscillators on the basis of the hysteresis of the phase difference signal or the phase control signal.

4. A phase-locked loop as in claim 1, wherein said selector has a configuration which permits said selector to select one of the outputs of said plurality of voltage-controlled oscillators under control from the outside of said phase-locked loop.

5. A phase-locked loop as in claim 1, wherein said frequency divider has a divide ratio of 1/n, with the number n being a positive integral number.

6. A phase-locked loop comprising:

a phase detector for comparing the phase of a reference signal with the phase of an internal signal to produce a phase difference signal proportional to the phase difference found between the signals, a filter for producing a phase control signal with a voltage value proportional to the phase difference signal, a plurality of voltage-controlled oscillators with different mean frequencies which oscillate at a frequency controlled according to the voltage value of the phase control signal, a controller for switching between the oscillating state and the stopped state of each of said plurality of voltage-controlled oscillators, a selector for selecting one of the outputs of said plurality of voltage-controlled oscillators on the basis of the phase difference signal or the phase control signal, and a frequency divider for dividing the frequency of the selected output to produce said internal signal, wherein, when a phase control signal changes its voltage value, said plurality of voltage-controlled oscillators vary their output frequencies equal amounts.

7. A phase-locked loop as in claim 6, wherein said plurality of voltage-controlled oscillators have different frequency variable-ranges which overlap one another.

8. A phase-locked loop as in claim 6, wherein the operation of said controller is controlled on the basis of the phase difference signal.

9. A phase-locked loop as in claim 6, wherein said selector selects one of the outputs of said plurality of voltage-controlled oscillators on the basis of the hysteresis of the phase difference signal or the phase control signal.

10. A phase-locked loop as in claim 6, wherein said selector has a configuration which permits said selector to select one of the outputs of said plurality of voltage-controlled oscillators under control from the outside of said phase-locked loop.

11. A phase-locked loop as in claim 6, wherein said frequency divider has a divide ratio of 1/n, with the number n being a positive integral number.

* * * * *